United States Patent [19]

Isohata et al.

[11] Patent Number: 4,708,465
[45] Date of Patent: Nov. 24, 1987

[54] EXPOSURE APPARATUS

[75] Inventors: Junji Isohata, Tokyo; Hironori Yamamoto, Chigasaki; Koichi Matsushita, Chiba, all of Japan

[73] Assignee: Canon Kabushiki Kaisha, Tokyo, Japan

[21] Appl. No.: 19,663

[22] Filed: Feb. 27, 1987

[30] Foreign Application Priority Data

Feb. 28, 1986 [JP] Japan .................................. 61-41428

[51] Int. Cl.⁴ ............................................. G03B 27/42
[52] U.S. Cl. ........................................ 355/53; 269/57; 355/73
[58] Field of Search .................... 269/57, 903; 355/43, 355/53, 73, 76

[56] References Cited

U.S. PATENT DOCUMENTS

| | | | |
|---|---|---|---|
| 3,651,401 | 3/1972 | Cooney | 269/57 |
| 3,930,684 | 1/1976 | Lasch, Jr. et al. | 355/73 X |
| 4,278,348 | 7/1981 | Funk et al. | 355/73 |
| 4,376,581 | 3/1983 | Mayer | 355/43 X |
| 4,669,866 | 6/1987 | Phillips | 355/43 |
| 4,669,867 | 6/1987 | Uda et al. | 355/53 |

*Primary Examiner*—Richard A. Wintercorn
*Attorney, Agent, or Firm*—Fitzpatrick, Cella, Harper & Scinto

[57] ABSTRACT

A position detecting device usable in an exposure apparatus for transferring an image of a first object onto a second object, for detecting the position of at least one of the first and second objects, includes a rotatable portion having a carrying portion for carrying thereon the at least one object, a first supporting member for supporting the rotatable portion, the first supporting member including a first driving system for moving the rotatable portion in a rotational direction, second supporting member for supporting the first supporting member, the second supporting member including a second driving system for moving the first supporting member in a rotational direction, and a displacement detecting system for detecting displacement of the first supporting member.

4 Claims, 3 Drawing Figures

EXPOSURE APPARATUS

FIELD OF THE INVENTION AND RELATED ART

This invention relates to an exposure apparatus for photoprinting, on a workpiece, an image of a pattern such as a microcircuit pattern formed on an original such as a mask. More particularly, the invention is concerned with an exposure apparatus for exposing different zones of a workpiece to images of a mask pattern or images of different mask patterns, with radiation and in sequence. The exposure apparatus of the present invention is particularly suitably usable, e.g., in the manufacture of large-size patterns such as a pattern to be used in a liquid crystal panel display device of large size.

Mirror projection type exposure apparatuses are used in the field of manufacture of semiconductor devices such as integrated circuits. In this type of exposure apparatuses, an original such as a mask or reticle having a circuit pattern and a workpiece such as a semiconductor wafer are placed on a movable carriage, and the carriage is moved relative to a radiation energy source whereby the whole surface of the workpiece is scanningly exposed to the pattern of the original with the radiation.

Recently, there is a tendency to increasing the diameter of semiconductor wafers in an effort to reduce the cost per one semiconductor chip. Also, it has recently been desired to manufacture large-size panel display devices such as a liquid crystal panel display device by use of photolithographic techniques. In order to meet enlargment of workpieces to be used, it is necessary to increase the size of a projection optical system as well as the length of scanning movement of the carriage carrying thereon the original and the workpiece. This disadvantageously leads to bulkiness of the projeciton exposure apparatus.

As a solution for such inconveniences, a "step-and-scan" exposure technique has already been proposed.

FIG. 1 shows an example of such "step-and-scan" type exposure apparatus, as disclosed in U.S. Patent Application Ser. No. 854,541 filed Apr. 22, 1986 and assigned to the same assignee of the subject application.

As shown in FIG. 1, the exposure apparatus is usable with four photomasks 1 (1a, 1b, 1c and 1d) each having a fine pattern formed on its lower surface. The exposure apparatus includes a mask stage 2 for carrying thereon one of the masks 1a–1d at a time. The mask stage 2 is movable in each of X, Y and θ (rotational) directions for fine adjustment of the position of the mask carried by the mask stage. Denoted in this Figure by numeral 3 is a glass substrate or base plate of rectangular square shape having a diagonal length of an order of fourteen (14) inches. For the manufacture of a liquid crystal panel display device, for example, a number of displaying picture elements as well as switching transistors for controlling actuation and de-actuation of the picture elements, capacitors, connecting terminals and so on are to be formed on the surface of the glass base plate 3 by ordinary photolithographic processes. The glass base plate 3 is held by a base-plate carrying stage 4 which is movable in each of the X, Y and θθ (rotational) directions. Also, the stage 4 is arranged to be moved stepwise in each of the X and Y directions, for the sake of plural-shot exposure of the glass base plate 3 as will be described later. Such step-feeding of the stage 4 is controlled by a fine movement-measuring system using a laser interferometer system, not shown. The exposure apparatus further includes a mirror projection optical system 5 of known type, comprising a combination of concave and convex mirrors. The mirror projection system is adapted to project, onto the glass base plate 3 at a unit magnification, an image of the pattern of one of the masks 1a–1d which is held at a predetermined position (exposure station) by the mask stage 2. An illumination optical system 6 includes a light source (not shown) for providing light of a predetermined wavelength or wavelength range to illuminate one of the masks held at the predetermined exposure station by the mask stage 2. By exposing a photosensitive layer formed on the glass base plate 3 to light passed through the pattern of the mask held by the mask stage 2, the fine pattern of such mask is photolithographically transferred onto the glass base plate 3. The mirror projection system 5 is disposed such that its optical axis is accurately aligned with the optical axis of the illumination optical system 6.

Denoted by numerals 7 and 7 are linear air-bearing assemblies (hereinafter simply "LAB") which are movable along two guide rails 8 and 8, respectively, extending in the Y direction. One of these bearing assemblies (LAB) is of the type in which it is constrained with respect to movement in the X direction (positive and negative) and in a Z direction (positive and negative). The other of the bearing assemblies is of the type in which it is constrained with respect to movement in the Z direction. A carriage 9 is provided to hold the mask stage 2 and the base-plate stage 4 in a predetermined relation, and is supported by the LAB 7. With this arrangement, the mask 1 carried by the mask stage 2 and the glass base plate 3 carried by the base-plate stage 4 can be scanningly moved as a unit in the Y direction relative to the projeciton system 5, during the exposure of the mask and the base plate to the light emitted from the illumination optical system 6.

The exposure apparatus further includes a mask feeder 11 for sequentially feeding the masks 1a–1d to the exposure station on he mask stage 2. That is, the mask feeder 11 is arranged to change masks each time the scanning exposure of one of different areas on the glass base plate 3 is completed. Gap sensors denoted by numeral 12 are provided to detect the distance between the surface of the base plate 3 and the focal plane of the projection optical system 5. For example, air-microsensors utilizing air pressure or photoelectric sensors utilizing reflection light from the base plate 3 are usable as the gap sensors. The projection optical system 5, the illumination optical system 6 and the guide rails 8 are supported by a base or surface plate 13 in a predetermined interrelation.

In the exposure apparatus of FIG. 1, as understood, the surface of the base plate 3 is imaginarily divided into, e.g., four different areas and these areas are sequentially placed at the exposure station under the projection optical system 5 with the aid of the step-feeding by the stage 4. Thus, four exposures are effected by use of four photomasks 1a–1d, whereby a substantially an integral pattern of large size, corresponding to "one layer" of the liquid crystal panel display device, is printed on the whole surface of the base plate 3. And, in order to achieve such "step-and-scan" exposure at a higher speed and with higher accuracy, the stage 4 is carried by the carriage 9.

The step 4 has a relatively heavy weight of an order of, e.g. 40 kg. As for the carriage 9, on the other hand, lightness in weight is desired because it must scanningly move, during the exposure, both the base plate 3 and one of the masks 1a–1d in relation to the projection optical system 5. so. the carriage 9 is liable to be susceptible to deformation. Further, the carriage 9 is floatingly supported by the LAB 7. Also, the stage 4 itself is made light as compared with those used in conventional lens projection type exposure apparatuses, so as to allow the stage 4 to be carried by the carriage 9. As a result, the stage 4 has not so high stiffness. These features result in a high possibility of occurrence of yawing of the stage 4 (rotational displacement in a plane containing the X and Y axes) and thus occurrence of $\theta$-error between the mask and the base plate 3 due to deformation of the carriage 9, inclination of the carriage 9 by the application of uneven load to the LAB 7, deformation of components of the stage 4 or for any other reason, during movement of the stage 4 carrying the base plate 3, by the motor 4a or the like for the step-feeding of the base plate 3.

Where such $\theta$ error is caused at the time of pattern transfer operation using a first mask (which is a mask having a pattern to be transferred onto a first layer on the plate-like member), there would occur partial overlapping, irregular gaps, shift or dislocation, or the like between the patterns sequentially transferred onto the surface of the plate-like member. This is because any alignment mark has not yet been formed on the plate-like member with respect to the first mask is not attainable. When, on the other hand, the yawing occurs at the time of pattern transfer operation using a second mask, a third mask or the like with respect to which the alignment of the plate-like member is attainable by use of alignment marks having been transferred ontot he plate-like member, an additional time is required to correct the $\theta$-error after completion of the movement of the plate-like member by the X-Y stage. This degrades the throughput of the apparatus.

In conventional exposure apparatuses, attempts have been made to improve stiffness of guide members or the like for the X-Y stage and to improve machining precision for such members, so as to prevent occurrence of yawing itself. However, occurrence of yawing can not be sufficiently prevented by these attempts. Also, the laser interferometer for detecting the amount of movement has its mirror mounted on the X-Y stage. this is not advantageous, as will be understood from the following description of the invention.

In order to obviate such inconveniences described above, a proposal has been made in the aforementioned U.S. Patent Application. According to this proposal, a mirror, called "square" and used as a component of the laser interferometer measuring system, is mounted on a rotationally movable $\theta$ table which is supported by an X-Y table movable in the X and Y directions. Also, means is provided to correct any yawing of the X-Y table during movement thereof in accordance with the measurement, the $\theta$ table is rotationally driven so as to avoid the yawing. This is effective to prevent disadvantageous pattern overlapping or the like, described hereinbefore, due to the yawing of the X-Y table.

SUMMARY OF THE INVENTION

It is a primary object of the present invention to provide an exposure apparatus, like the aforementioned U.S. patent application, in which any yawing of a table or stage, carrying thereon an original or a workpiece, during movement thereof is automatically detected and corrected, thereby to avoid undesirable shift of patterns transferred onto the workpiece, due to the yawing.

It is another object of the present invention to provide an exposure apparatus wherein alignment of a workpiece with respect to an original in a rotational direction can always be achieved very accurately with the aid of a laser interferometer measuring system, regardless of the positioning accuracy of the workpiece having been determined at a prealignment stage made preparatorily. That is, if, at the time of start of fine alignment of the original and the workpiece, the workpiece has been positioned with a relatively poor positioning accuracy in the rotational direction as determined by the prealignment stage, it is necessary to rotationally displace a workpiece carrying stage by a relatively large angle for the correciton of the rotational error. The present invention, in this aspect, aims at assuring the $\theta$-error correction by use of the laser interferometer measuring system, regardless of the magnitude of the $\theta$-error.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENT

Figure 1:
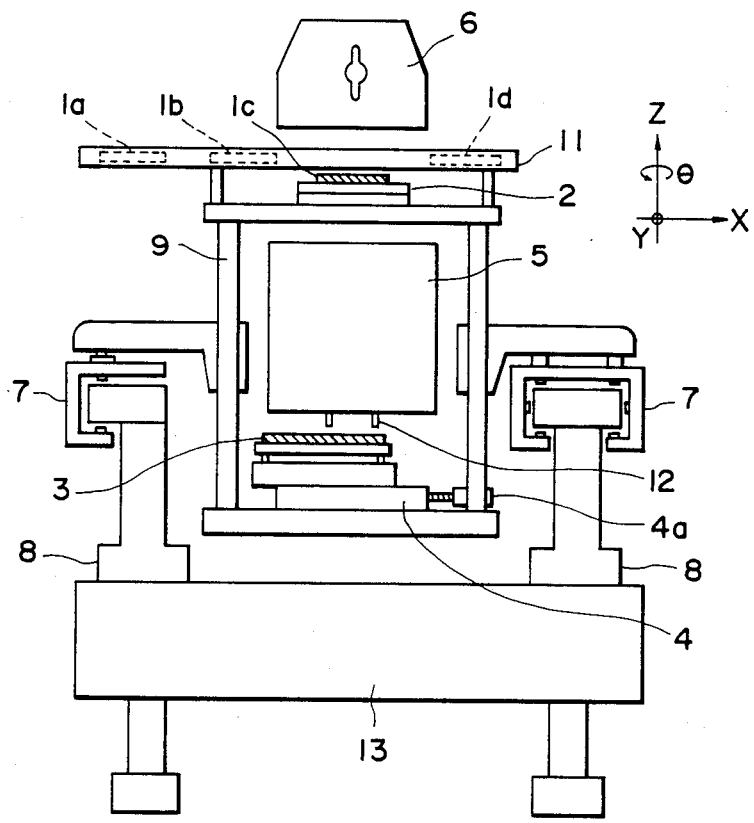
FIG. 1 is a schematic view of an exposure apparatus of the type that is disclosed in the aforementioned U.S. Patent Application.
Figure 2:
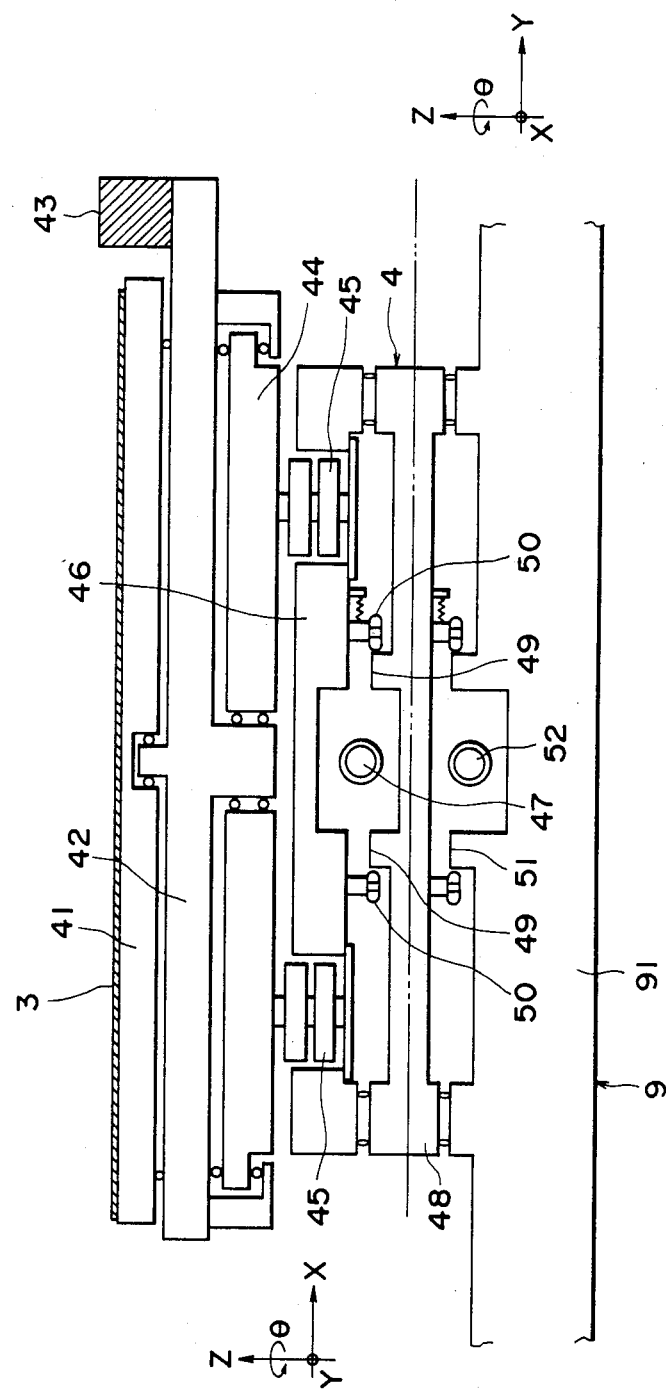
FIG. 2 is a sectional view schematically showing a general arrangement of a base-plate carrying stage employed in an exposure apparatus according to an embodiment of the present invention.
Figure 3:
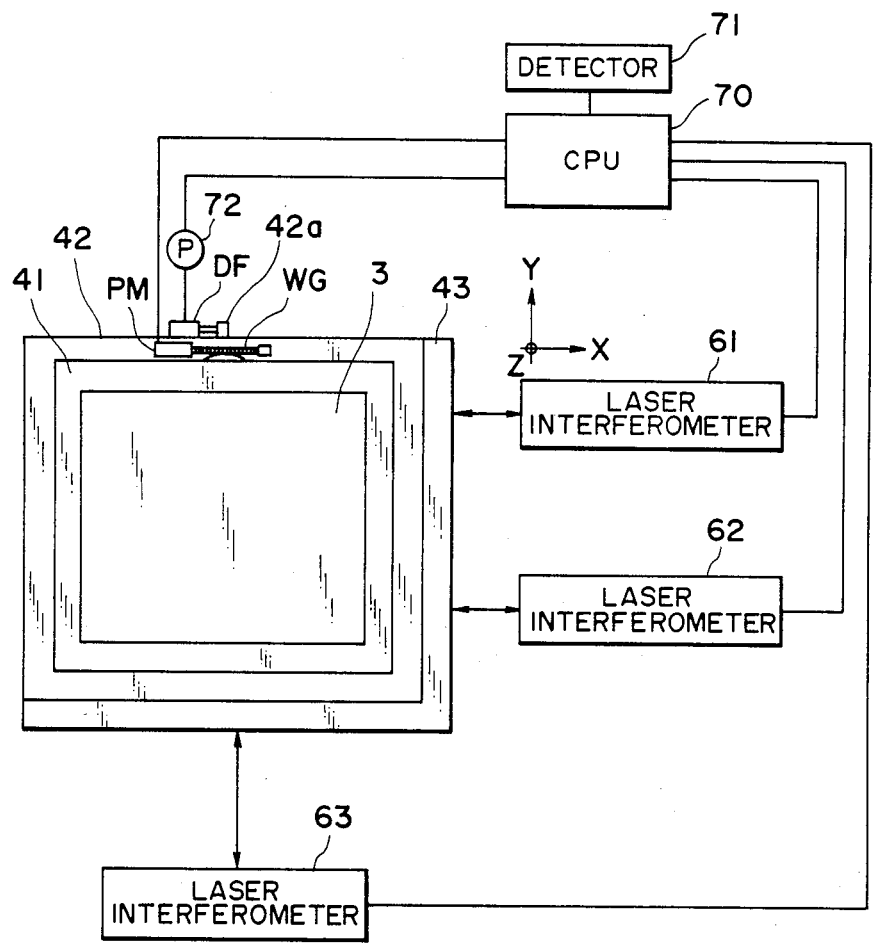
FIG. 3 is a schematic and diagrammatic view showing the interrelation between the base-plate carrying stage, shown in FIG. 2, and a laser interferometer measuring system employed in the exposure apparatus of the present embodiment.

Referring now to FIGS. 2 and 3, description will be made to an exposure apparatus according to one preferred embodiment of the present invention. In FIGS. 2 and 3, like numerals as those in the FIG. 1 arrangement are assigned to similar or corresponding elements.

In the present embodiment, like the FIG. 1 arrangement, the invention is applied to an exposure apparatus of mirror projection type, and the apparatus includes a mask stage, a projection optical system an illumination optical system, linear air-bearing assemblies (LAB), guide rails, a carriage, a mask feeder, gap sensors and a surface plate (such as at 2, 5–9 and 11'13 in FIG. 1) all of which are provided in the same way as in the FIG. 1 arrangement. Denoted in FIGS. 2 and 3 by numeral 41 is a first $\theta$-table having a wider rotatable range. In this embodiment, the first $\theta$-table 41 functions also as a chuck for holding a workpiece such as a base plate 3 on a base-plate carrying stage 4. Denoted by numeral 42 is a second $\theta$-table having a relatively narrow rotatable range. The second $\theta$-table 42 is adapted to rotationally move the base plate 3 as a unit with the first $\theta$-table 41. The first $\theta$-table 41 is rotatably mounted on the second $\theta$-table 42, with a ball-bearing assembly intervening therebetween. The first $\theta$-table 41 is rotationally driven by a pulse motor PM, provided on the second $\theta$-table 42, through a worm gearing mechanism WG. Denoted at 43 is an L-shaped mirror, called "square". Denoted at 44 is an X-Y table on which the second θ-table 42 is rotatably mounted, with another ball-bearing assembly intervening therebetween. A diaphragm driving mechanism DF is provided on the X-Y table 44 so as to drive the second θ-table 42 by pushing/pulling a protrusion 42a formed on the second θ-table 42. Actuators 45—45 are provided to displace the base plate 3 in the direction of Z axis for focus adjustment and tilt adjustment. The actuators 45—45 each comprises piezoelectric device and others. Y-slider 46 is arranged to move in the Y-axis direction along Y-guides 49—49, formed on an X-slider 48, in accordance with rotation of ball screw 47 which is driven by a motor, not shown. The X-Y table 44 is mounted to the Y-slider 46 by way of the actuators 45 - 45. Denoted by numerals 50—50 are sliding elements provided to assure movement of the Y-slider 46 following the Y-guides 49—49. The X-slider 48 is movable in the X direction along X-guides 51—51, formed on an upper surface of a base 91 for the carriage 9 and extending in the X direction, in accordance with rotation of a ball-screw 52 which is driven by an unshown motor. It is added that an upper half of FIG. 2 divided at a phantom line shows a section of the stage 4 as viewed in the Y direction while a lower half of FIG. 2 shows a section of the stage 4 as viewed in the X direction.

The exposure apparatus of the present embodiment further includes a laser interferometer measuring system for measuring displacement of the base plate 3 and thus for detecting the position of the base plate 3. The laster interferometer measuring system includes three laser interferometers 61-63. Of these laser interferometers, two laser interferometers 61 and 62 each is provided to read the position of the baseplate carrying stage 4 in the X-axis direction. On the other hand, the third laser interferometer 63 is provided so as to read the position of the base-plate carrying stage 4 in the Y-axis direction. Central processing unit 70 (hereinafter "CPU") is adapted to receive output signals from the laser interferometers 61-63 and output signals from a photoelectric detecting means 71 of known type that is arranged to detect the relative position of the mask and the base plate. On the basis of the signals supplied, the CPU 70 controls the pulse motor PM and a suitable pressure-controlling means 72 that is effective to actuate the diaphragm driving mechanism DF.

Where the data obtained at the laser interferometers 61 and 62, i.e. the moving amounts of the base-plate carrying stage 4 in the X-axis direction and from reference positions as detected at the laser interferometers 61 and 62, are denoted by X1 and X2, respectively, and when the interval between these laser interferometers 61 and 62 is denoted by L, then the angle of yawing "θ" can be given by the following equation:

$$\theta = \tan^{-1}(X1 - X2)/L$$

Thus, upon position adjustment of the stage in the rotational direction for the correction of the angle of yawing "θ" after completion of the stepwise movement and for the positioning of the base plate with respect to the photomask where the base plate having been prealigned has a poor positioning accuracy with respect to the rotational direction, the second θ-table 42 and the first θ-table 41 are rotationally displaced, respectively. Also, if necessary, the X-Y table 44 is displaced for the position adjustment in the X and Y directions. The rotational movements of the first and second θ-tables 41 and 42 and the X-Y displacement of the X-Y table 44 are controlled under the influence of the CPU 70. By this, the base-plate carrying stable 4 can be positioned with very high accuracy.

In the present embodiment, as described hereinbelow, the θ-stage means comprises two, first and second, θ-tables 41 and 42. And, for the correction of any yawing, only the second θ-table 42 is used in combination with the laser interferometer measuring system. By this, the yawing can be corrected accurately and exactly. On the other hand, where the base plate having been prealigned has a poor positioning accuracy with respect to the rotational direction so that a relatively large angle of rotation of the θ-stage means, e.g. an angle of 0.15 degree, is required for aligning the base plate with respect to the mask, first the positional deviation between the mask and the base plate is detected by photoelectric detection using alignment marks provided on the mask and the base plate and, secondly, the first θ-table 41 on which the square is not provided is rotationally driven in an open-loop controlling manner by an amount corresponding to the rotational error (θ error) detected by the photoelectric detection. Subsequently, by using the second θ-table 42 and in accordance with the photoelectric detection and the measurement by the laser interferometer system, the positioning with respect to the rotational direction is carried out with high accuracy. In this case, as an example, the second θ-table 42 is held at its standard position (the position at which the laser beams from the laser interferometers are incident perpendicularly on the reflection surface of the square 43) and, on the other hand, the first θ-table is rotationally displaced by the pulse motion PM so as to reduce the θ error to an amount less than the resolution of the pulse motor PM. If this is done, then the amount of rotational displacement required finally for the second θ-table 42 becomes substantially less than the amount of rotational movement of the first θ-table 41 corresponding to a unit pulse of the pulse motor PM, i.e. the resolution of the pulse motor PM. The rotational displacement of the second θ-table 42 of an amount such as described above hardly causes reflection of the laser beam with so large reflection angle that the reflected laser beam does not come back to the laser interferometer. Namely, the phenomenon called "laser error" hardly occurs.

While, in the foregoing, the present invention has been described with reference to an exposure apparatus of mirror projection type, the invention is applicable also to other types of exposure apparatuses, such as for example proximity type exposure apparatuses, contact type exposure apparatuses, lens projection type exposure apparatuses (called steppers) in which the pattern is transferred at a reduced scale. When, for example, the invention is applied to the stepper, the accuracy of step-feeding of the stage can be significantly improved particularly at the time of the exposure operation using a first mask. This is also the case with the exposure operation using a second mask, a third mask, etc. in an occasion that the step-feeding of the stage is made while relying on the precision of measurement by laser interferometers.

In accordance with the present invention, as has hitherto been described, a square for the laser beam measurement is mounted on a θ-stage means operative to correct a positional error, in a rotational direction, of a plate-like member to be exposed. And, on the basis of the result of measurement by use of such square, any yawing of a stage, carrying the plate-like member and the θ-stage means caused during movement of the stage is detected and corrected. With this arrangement, deviation θ of the plate-like member in the rotational direction due to the yawing of the stage at the time of step-feeding thereof is sufficiently suppressed, wherby higher accuracy is attainable in the step-feeding of the stage.

Also, suppression of θ-deviation of the plate-like member upon completion of the step-feeding leads to reduction in time required for alignment thereof with respect to an original or mask, with the result that the throughput of the apparatus is improved.

Further, in accordance with the present invention, the θ-stage means carrying thereon the workpiece is provided by a combination of a first θ-table, on which the workpiece is to be placed, and a second θ-table on which the first θ-table is rotatably mounted. The mirror element of the laser interferometer system is mounted on the second θ-table. At the time of aligning the original and the workpiece, any 0 error of a relatively large amount is corrected by rotationally displacing the first θ-table. On the other hand, the second θ-table is used for the correction of the yawing and, as desired, for the higher-accuracy correction of the θ-error upon the fine alignment of the original and the workpiece. With such arrangement, the amount of rotation required for the second θ-table can be reduced, with the result that the occurrence of "laser error" can be effectively prevented.

Where the invention is applied to a stage device for carrying thereon an original such as a photomask, any yawing of the stage at the time of conveyance of the original from an original storing position to an exposure position (photoprinting station), can be detected and corrected accurately. Therefore, changing of masks and/or setting of a mask at the exposure position can be achieved quickly and accurately. Moreover, undesirable "laser error" can also be prevented effectively.

While the invention has been described with reference to the structures disclosed herein, it is not confined to the details set forth and this application is intended to cover such modifications or changes as many come within the purposes of the improvements of the scope of the following claims.

What is claimed is:

1. A position detecting device usable in an exposure apparatus for transferring an image of a first object onto a second object, for detecting the position of at least one of the first and second objects, said device comprising:
   a rotatable portion having a carrying portion for carrying thereon said at least one object;
   first supporting means for supporting said rotatable portion, said first supporting means including first drivng means for moving said rotatable portion in a rotational direction;
   second supporting means for supporting said first supporting means, said second supporting means including second driving means for moving said first supporting means in a rotational direction; and
   displacement detecting means for detecting displacement of said first supporting means.

2. A device according to claim 1, further comprising correction means for correcting, in accordance witht he detection by said displacement detecting means, rotational displacement of said first supporting means caused by rotational displacement of said second supporting means.

3. A device according to claim 1, wherein said first supporting means has a square mounted thereon and said displacement detecting means includes a laser interferometer for detecting displacement of said square.

4. A device according to claim 3, further comprising control means operable in response to an output signal from said laser interferometer to position said at least one object in a rotational direction.

* * * * *

UNITED STATES PATENT AND TRADEMARK OFFICE
CERTIFICATE OF CORRECTION

PATENT NO. : 4,708,465

DATED : November 24, 1987

INVENTOR(S) : JUNJI ISOHATA, ET AL.

It is certified that error appears in the above-identified patent and that said Letters Patent is hereby corrected as shown below:

AT [57] IN THE ABSTRACT

Line 9, "second" should read --a second--.

COLUMN 1

Line 37, "projeciton" should read --projection--.
Line 63, "θθ" should read --θ--.

COLUMN 2

Line 35, "projeciton" should read --projection--.
Line 40, "he" should read --the--.
Line 60, "an" should be deleted.
Line 67, "step 4" should read --stage 4--.

COLUMN 3

Line 4, "so." should read --So,--.
Line 29, "member with" should read --member so that alignment of the plate-like member with--.
Line 34, "ontot he" should read --onto the--.
Line 46, "this" should read --This--.
Line 58, "measurement," should read --result of measurement by the laser interferometer measuring system. More particularly, in accordance with the measurement,--.

UNITED STATES PATENT AND TRADEMARK OFFICE
CERTIFICATE OF CORRECTION

PATENT NO. : 4,708,465

DATED : November 24, 1987

INVENTOR(S) : JUNJI ISOHATA, ET AL.

It is certified that error appears in the above-identified patent and that said Letters Patent is hereby corrected as shown below:

COLUMN 4

Line 16, "correciton" should read --correction--.
    Line 44, "to" (first occurrence) should read --of--.
    Line 51, "system an" should read --system, an--.
    Line 51, "11'13" should read --11-13--.

COLUMN 5

Line 1, "at" (both occurrences) should read --by--.
    Line 33, "baseplate" should read --base-plate--.

COLUMN 6

Line 2, "stable" should read --stage--.

COLUMN 7

Line 5, "wherby" should read --whereby--.
    Line 20, "0" should read --$\theta$--.

UNITED STATES PATENT AND TRADEMARK OFFICE
CERTIFICATE OF CORRECTION

PATENT NO. : 4,708,465

DATED : November 24, 1987

INVENTOR(S) : JUNJI ISOHATA, ET AL.

It is certified that error appears in the above-identified patent and that said Letters Patent is hereby corrected as shown below:

COLUMN 8

Line 4, "many" should read --may--.
Line 16, "drivng" should read --driving--.
Line 25, "correction" should read --correcting--.
Line 25, "witht he" should read --with the--.

Signed and Sealed this

Twelfth Day of July, 1988

Attest:

DONALD J. QUIGG

Attesting Officer

Commissioner of Patents and Trademarks